(12) United States Patent
Chang et al.

(10) Patent No.: US 6,239,468 B1
(45) Date of Patent: May 29, 2001

(54) SENSOR THIN FILM TRANSISTOR FOR AN OPTICAL DETECTING SENSOR

(75) Inventors: Youn Gyoung Chang; Jeong Hyun Kim, both of Kyunggi-do; Se June Kim, Seoul; Jae Kyun Lee, Kyunggi-do; Jong Hoon Yi, Seoul, all of (KR)

(73) Assignee: LG. Philips LCD Co. Ltd., Seoul (KR)

( * ) Notice: Subject to any disclaimer, the term of this patent is extended or adjusted under 35 U.S.C. 154(b) by 0 days.

(21) Appl. No.: 09/456,389

(22) Filed: Dec. 8, 1999

(30) Foreign Application Priority Data

Dec. 10, 1998 (KR) .................................................. 98-54096

(51) Int. Cl.$^7$ .......................... H01L 27/01; H01L 27/12; H01L 31/0392
(52) U.S. Cl. ......................... 257/347; 357/350; 357/401
(58) Field of Search ................................... 257/357, 350, 257/401, 296

(56) References Cited

U.S. PATENT DOCUMENTS

| | | | |
|---|---|---|---|
| 5,200,634 | * | 4/1993 | Tsukada et al. ........................ 257/291 |
| 5,763,899 | * | 6/1998 | Yamazaki et al. ....................... 257/59 |
| 5,789,791 | * | 8/1998 | Bergemont ............................. 257/401 |
| 5,814,834 | * | 9/1998 | Yamazaki et al. ....................... 257/59 |

* cited by examiner

*Primary Examiner*—Ngân V. Ngô
(74) *Attorney, Agent, or Firm*—Long Aldridge & Norman LLP

(57) ABSTRACT

A sensor TFT includes a substrate, a gate electrode formed on the substrate, a semiconductor layer patterned on the insulating layer to generate an optical current using received light, source and drain electrodes formed on the semiconductor layer, the source and drain electrodes being spaced apart from each other, and a conductive channel defined by an area between the source and drain electrodes, wherein the conductive channel is not rectangular-shaped, such that the channel width is increased for a fixed channel length.

15 Claims, 5 Drawing Sheets

SENSOR THIN FILM TRANSISTOR FOR AN OPTICAL DETECTING SENSOR

This application claims the benefit of Korean Patent Application No. 1998-54096, filed on Dec. 10, 1998, which is hereby incorporated by reference.

BACKGROUND OF THE INVENTION

1. Field of the Invention

The present invention relates to a thin film transistor (TFT) and, more particularly, to a sensor TFT used in an optical detecting sensor that can detect light reflected from an object.

2. Discussion of the Related Art

A thin film transistor type optical detecting sensor can be used as an image reader of an image detecting system such as a character recognition system, a fingerprint recognition system and a telecopy machine.

As shown in FIG. 1A, such a TFT type optical detecting sensor comprises a window through which light is transmitted, a sensor TFT (ST) for forming an optical current using light reflected from an object, a current charging part, or a storage capacitor (SC) for charging current flowing through the sensor TFT (ST), and a switching part, or a switch (SW) for selectively discharging the current charged in the current charging part (SC).

In operation, when light reflected from the object to be read is transmitted to an active area formed between drain and source electrodes of the sensor TFT (ST), an optical current flows along the active area. The optical current is then transmitted to an external circuit through the current charging part (SC) and the switching part (SW). At this point, the optical current corresponds to information on an image of the object. That is, the amount of the optical current varies according to the strength of the reflected light. In addition, the amount of the optical current further depends on the length and width of the active area to which the reflected light is introduced.

For example, when the length of the active area is fixed, the amount of the optical current is increased as the width of the active area is increased.

As is well known, as the amount of the optical current is increased, the image information becomes more accurate. Accordingly, by enlarging the width of the active area relative to the length, the amount of the optical current can be increased. However, when the width is increased, since the sensor TFT occupies much space, it is very difficult to improve the degree of integration of the sensor.

To solve the above problems, a method has been developed for increasing the current ratio as a function of light intensity by reducing an off current flowing along a semiconductor layer of the sensor TFT. To realize this, a second sensor gate electrode is provided between a first sensor gate electrode and a semiconductor layer.

FIG. 1B shows a conventional sensor TFT.

The conventional sensor TFT comprises a first gate electrode 23 for performing an On/Off operation of a transistor by receiving a voltage from a gate wiring; second gate electrodes 27a and 27b disposed on the first gate electrode, the second gate electrodes 27a and 27b spaced away from each other in parallel; a semiconductor layer 31 formed on the second gate electrodes 27a and 27b; and source and drain electrodes 33 and 35 disposed on the second gate electrodes 27a and 27b, respectively.

An exposed portion of the semiconductor layer 31 between the source and drain electrodes 33 and 35 is an active area or conducting channel which has a length L and a width W. That is, the length L becomes a channel length of the semiconductor layer along which the optical current flows, and the width W becomes a channel width of the semiconductor layer.

FIG. 2 is a sectional view taken along line II—II of FIG. 1B for illustrating a manufacturing process of the sensor TFT.

A metal conductive layer is first deposited on a glass substrate 21, then patterned into the first gate electrode 23. A first insulating layer 25 is formed on the substrate, covering the first gate electrode 23.

The second gate electrodes 27a and 27b are formed on the first insulating layer 25, then a second insulating layer 29 is formed on the substrate while covering the second gate electrodes 27a and 27b.

An amorphous silicon layer is deposited on the second insulating layer 29, then patterned into the semiconductor layer 31.

A contact hole 28 is formed on the second insulating layer 29 so that the drain electrode 35 can be electrically connected to the second gate electrode 27a.

Next, the source and drain electrodes 33 and 35 are formed on the second insulating layer 29 while respectively covering both edges of the semiconductor layer 31.

Finally, a protecting layer 37 is formed covering the semiconductor layer 31, and the source and drain electrodes 33 and 35.

In the above described sensor TFT, the first gate electrode 23 is always applied with a negative voltage as the sensor TFT operates with an optical current created by light in an Off state. The optical current created by the light reflected from an object flows along the semiconductor layer 31. At this point, a hole is generated at a portion of the semiconductor layer 31 contacting the second insulating layer 29 by the negative voltage applied to the first gate electrode 23. A current generated by the hole is called an Off current. In this state, when the light is radiated, electron-hole pairs are formed on the semiconductor layer 31 by the light energy.

The holes of the electron-hole pairs are directed to the source electrode 33 along the hole channel formed by a gate voltage, and the electrons are directed to the drain electrode 35 to produce optical current.

Since there is a limit to an amount of the optical current generated in a TFT having a predetermined ratio between the width and length of the channel, if the amount of the off-current is too much, the display quality will be not good.

Accordingly, to increase an optical current ratio by reducing the amount of the off-current, the second gate electrode 27a is provided between the semiconductor layer 31 and the first gate electrode 23. That is, to apply a positive voltage to the source and drain electrodes 33 and 35, the drain electrode 35 is connected to the second gate electrode 27a so that an equi-potential can be generated on the semiconductor layer 31 disposed between the drain electrode 35 and the second gate electrode 27a. The equi-potential characteristic suppresses the generation of holes, reducing the amount of the off-current flowing along the semiconductor layer.

However, in the above-described conventional sensor TFT, since an additional process for forming the second gate electrodes 27a and 27b is further required, the manufacturing process is complicated.

SUMMARY OF THE INVENTION

Accordingly, the present invention is directed to a thin film transistor type photo detecting sensor, a thin film transistor and a method for fabricating the same that substantially obviates one or more of the problems due to limitations and disadvantages of the related art.

An object of the present invention is to provide a sensor TFT that can increase the amount of the optical current flowing along the semiconductor layer without using the second gate electrodes.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve the above-need, the present invention provides a sensor TFT comprising a substrate, a gate electrode formed on the substrate; an insulating layer covering the substrate and gate electrode a semiconductor layer patterned on the insulating layer to generate an optical current using received light, source and drain electrodes formed on the semiconductor layer, the source and drain electrodes being spaced apart from each, and a conductive channel defined by a space between the source and drain electrodes, the conductive channel being non-rectangularly-shaped.

The source and drain electrodes are preferably made of a transparent material selected from the group consisting of ITO, $TiO_2$ and $SnO_2$.

The gate electrode is rectangular-shaped having first, second, third and fourth sides, the first side being connected to a gate wire.

The source electrode comprises a plurality of horizontal portions disposed parallel to the first side of the gate electrode and a vertical portion interconnecting ends of the horizontal portions proximal to the second sides of the gate electrode, the vertical portion being connected to a source electrode wiring; and the drain electrode comprises a plurality of horizontal portions which are disposed in parallel between the horizontal portions of the source electrode and a vertical portion interconnecting ends of the horizontal portions proximal to the third side of the gate electrode.

The source electrode comprises a vertical portion connected to a source electrode wiring and disposed parallel to the second side of the gate electrode, a first horizontal portion extending from one end of the vertical portion proximal to the first side to be parallel to the first side of the gate electrode, a second horizontal portion extending from the other end of the vertical portion proximal to the fourth side of the gate electrode to be parallel to the fourth side of the gate electrode, and a plurality of vertical branch portions alternately branched off from the first and second horizontal portions to be parallel to the vertical portion, and the drain electrode at a predetermined distance from each portion of the source electrode.

The conductive channel is S-shaped or saw-tooth-shaped.

According to another aspect of the present invention, a combination comprises a gate electrode formed on a substrate, an insulating layer formed on the gate electrode, a semiconductor layer formed on the insulating layer, and source and drain electrodes source and drain electrodes formed on the semiconductor layer, the source and drain electrodes being spaced away from each to define a conductive channel and the conductive channel having at least one curve or bend.

According to still another aspect of the present invention, a TFT type optical sensor comprises a sensor part comprising a gate electrode, a semiconductor layer, and source and drain electrode spaced away from each other; a storage capacitor connected to the drain electrode to store charges discharged from the drain electrode; and a switching part for selectively outputting the charges stored in the storage capacitor to an external system.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings:

FIG. 8b is an enlarged view of a portion A of FIG. 8a.

DETAILED DESCRIPTION OF THE PREFERRED EMBODIMENTS

Reference will now be made in detail to the preferred embodiment of the present invention, example of which is illustrated in the accompanying drawings.

Figure 1A:
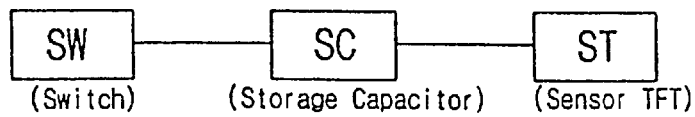
FIG. 1A is a diagram of a conventional TFT type optical detecting sensor.
Figure 1B:
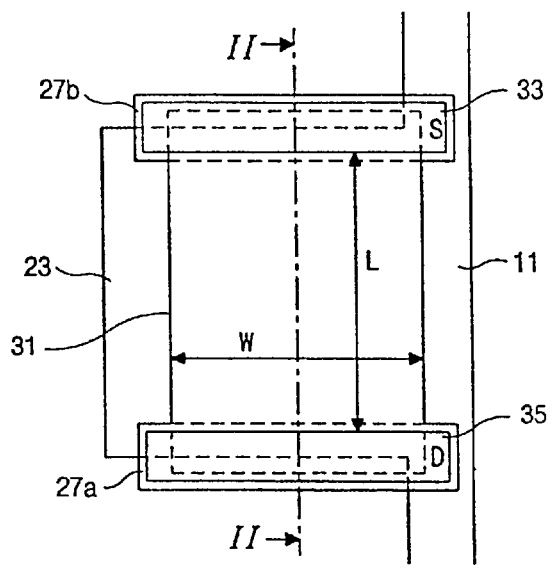
FIG. 1B is a plane view of a conventional sensor TFT.
Figure 2:
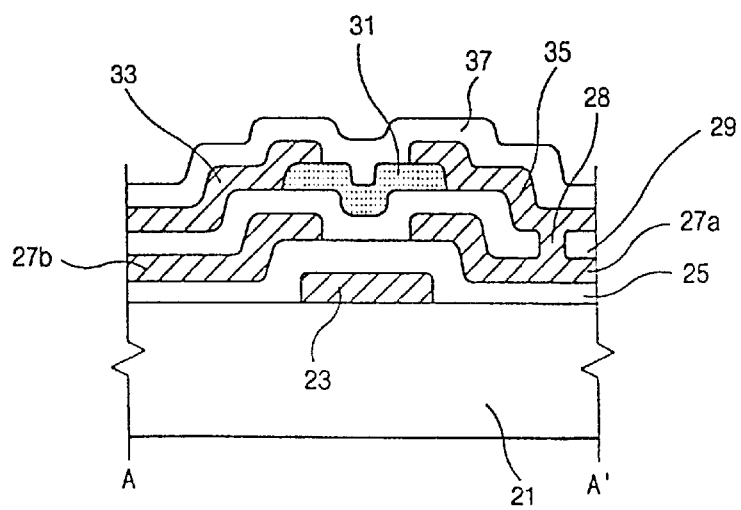
FIG. 2 is a sectional view taken along a line II—II of FIG. 1B.
Figure 3:
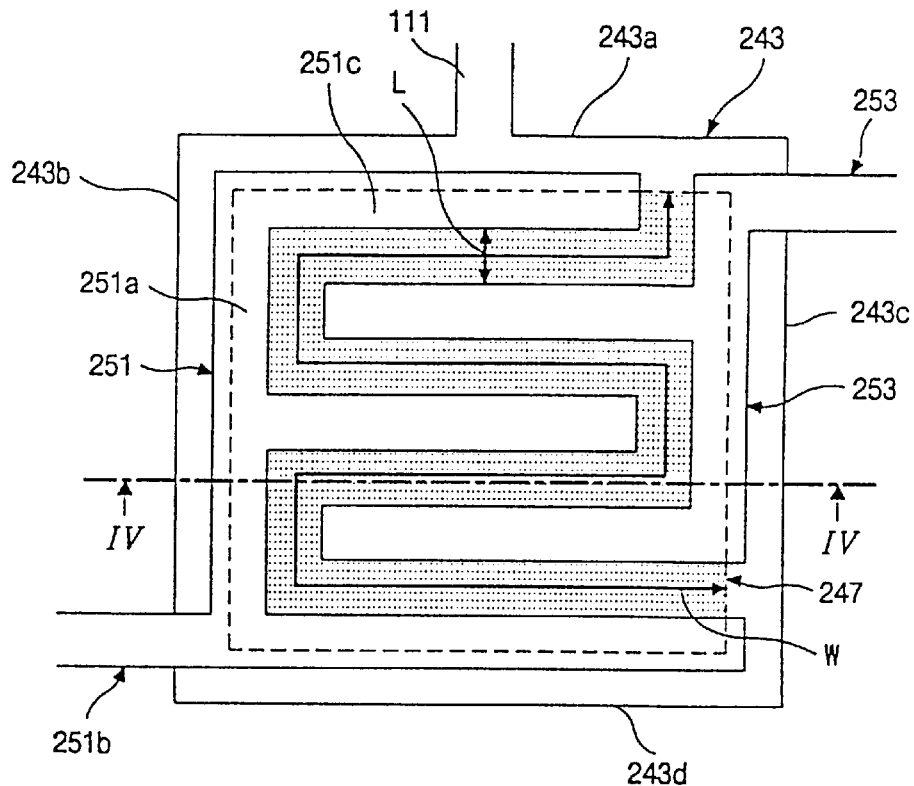
FIG. 3 is a plane view of a sensor TFT according to a first embodiment of the present invention.
Figure 4:
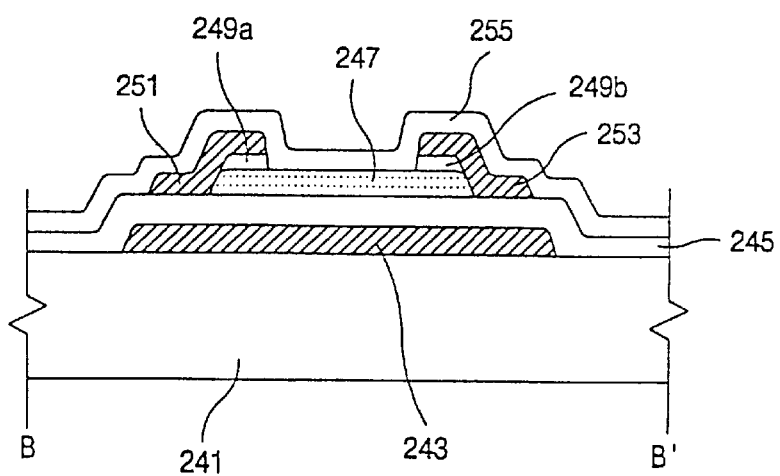
FIG. 4 is a sectional view taken a line IV—IV of FIG. 3.

FIG. 3 shows a plane view of a sensor TFT according to a first embodiment of the present invention, and FIG. 4 shows a sectional view taken along a line IV—IV of FIG. 3.

A gate electrode 243 for turning On/Off a transistor by receiving a voltage from a gate wiring 111 is formed on a substrate 241. An insulating layer 245 is formed on the substrate 241 while covering the gate electrode 243. The gate electrode 243 is rectangular-shaped having first, second, third and fourth sides 243a, 243b, 243c and 243d. Formed on the gate electrode 243 is an island semiconductor layer 247. Source and drain electrodes 251 and 253 are formed on the insulating layer 245 while covering a portion of the semiconductor layer 247. The source electrode 251 comprises a plurality of horizontal portions 251c disposed parallel to the first side 243a of the gate electrode 243 and a vertical portion 251a interconnecting ends of the horizontal portions 251c proximal to the second sides 243b of the gate electrode 243. The vertical portion 251a of the source electrode 251 is connected to a source electrode wiring 251b. The drain electrode 253 comprises a plurality of horizontal portions 253c, which are disposed in parallel between the horizontal portions 251c of the source electrode 251, and a vertical portion 253a interconnecting ends of the horizontal portions 251c proximal to the third side 243c of the gate electrode 243.

Accordingly, the length L of the channel of the semiconductor layer becomes short, while the width W of the channel of the semiconductor layer becomes long. Accordingly, the W/L ratio is substantially increased.

A process for manufacturing the above-described sensor TFT will be described hereinafter with reference to FIG. 4.

The gate electrode 243 is first formed on the substrate 241 in a predetermined pattern. The gate electrode is made of a material selected from the group consisting of Al, Mo, Cr, W, and W—Mo.

Next, the insulating layer 245 is formed on the substrate while covering the gate electrode 243, then the semiconductor layer 247 is deposited on the insulating layer 245. The insulating layer 245 is made of SiNx or SiOx, and the semiconductor layer 247 is made of a-Si:H.

Next, ohmic contact layers 249a and 249b are formed on edges of the semiconductor layer 247 to reduce a contact resistance with the source and drain electrodes 251 and 253 which will be formed on the ohmic contact layers 249a and 249b, respectively.

The source and drain electrodes 251 and 253 are preferably formed of a transparent material selected from the group consisting of ITO, TiO, and $SnO_2$.

The drain electrode 253 is used to apply a signal voltage to the semiconductor layer 247, and the source electrode 251 is used to discharge current flowing along the semiconductor layer 247 to a storage device.

At this point, the charges discharged to the storage device is output as display information by being transmitted to a circuit portion by a switching portion.

Finally, a protecting layer 255 is formed on the substrate while covering the semiconductor layer 247 and the source and drain electrodes 251 and 253. Preferably, the protecting layer 255 is formed of a transparent organic material such as acryl, polyamid and benzocyclobutene.

Figure 5:
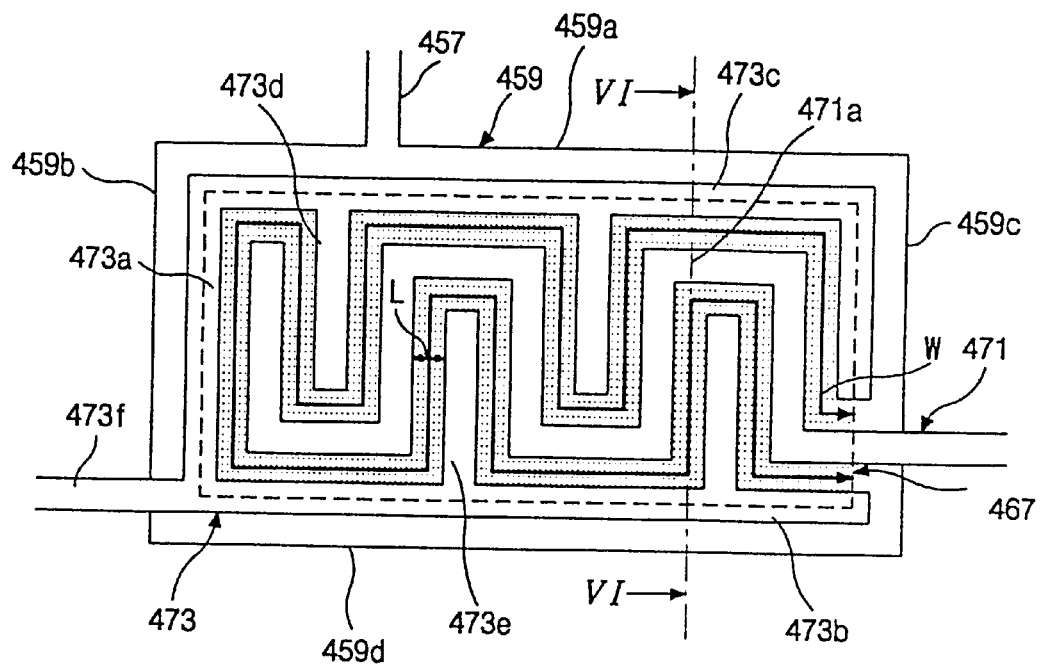
FIG. 5 is a plane view of a sensor TFT according to a second embodiment of the present invention.
Figure 6:
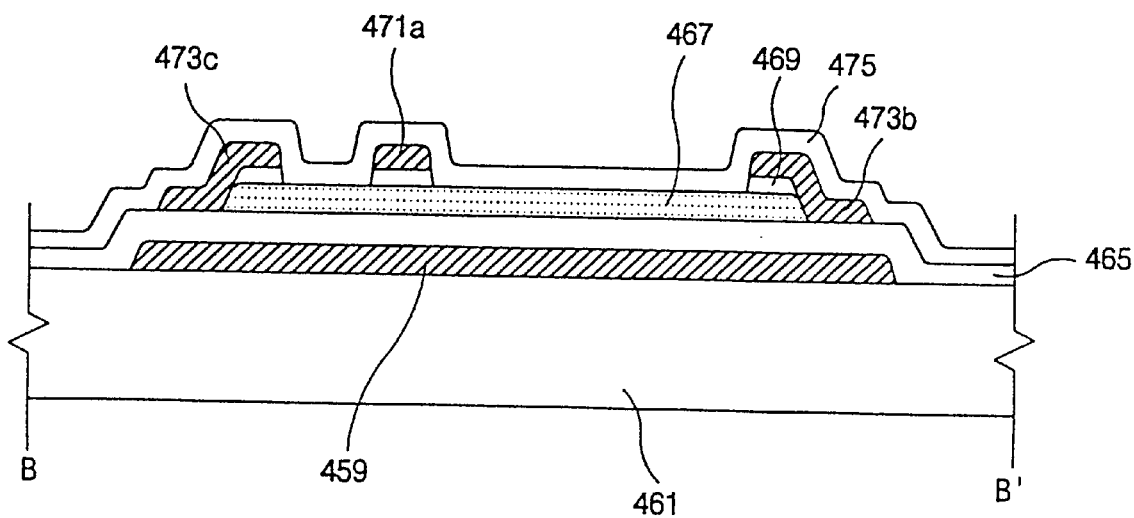
FIG. 6 is a sectional view taken along a line VI—VI of FIG. 5.

FIG. 5 shows a plane view of a sensor TFT according to a second embodiment of the present invention, and FIG. 6 shows a sectional view taken along a line VI—VI of FIG. 5.

A gate electrode 459 for turning On/Off the transistor by receiving a voltage from a gate wiring 457 is formed on a substrate 461. An insulating layer 465 is formed on the substrate 461 while covering the gate electrode 459. The gate electrode 459 is rectangular-shaped having first, second, third and fourth sides 459a, 459b, 459c, and 459d. An insulating layer 465 is formed on the substrate 461 while covering the gate electrode 459. Source and drain electrodes 473 and 471 are formed on the insulating layer 465 while covering a portion of the semiconductor layer 467. The source electrode 473 comprises a vertical portion 473a connected to a source electrode wiring 473f and disposed parallel to the second side 459b of the gate electrode 459, a first horizontal portion 473c extending from one end of the vertical portion 473a proximal to the first side 459a to be parallel to the first side 459a of the gate electrode 459, a second horizontal portion 473b extending from the other end of the vertical portion 473a proximal to the fourth side 459d of the gate electrode 459 to be parallel to the fourth side 459d, and a plurality of vertical branch portions 473d alternately branched off from the first and second horizontal portions 473c and 473b to be parallel to the vertical portion 473a. The drain electrode 471 is disposed at a predetermined distance from each portion of the source electrode 473.

In the above-described sensor TFT, the ratio of the width W of the channel of the semiconductor layer 467 with respect to the length L of the semiconductor layer 462, which is defined by the shortest horizontal distance between the source and drain electrodes 473 and 471, can be increased. As a result, since the amount of off-current can be reduced, the display characteristic can be improved.

Since a process for manufacturing the above-described sensor TFT is identical to the first embodiment, the detailed description thereof will be omitted herein.

Figure 7A:
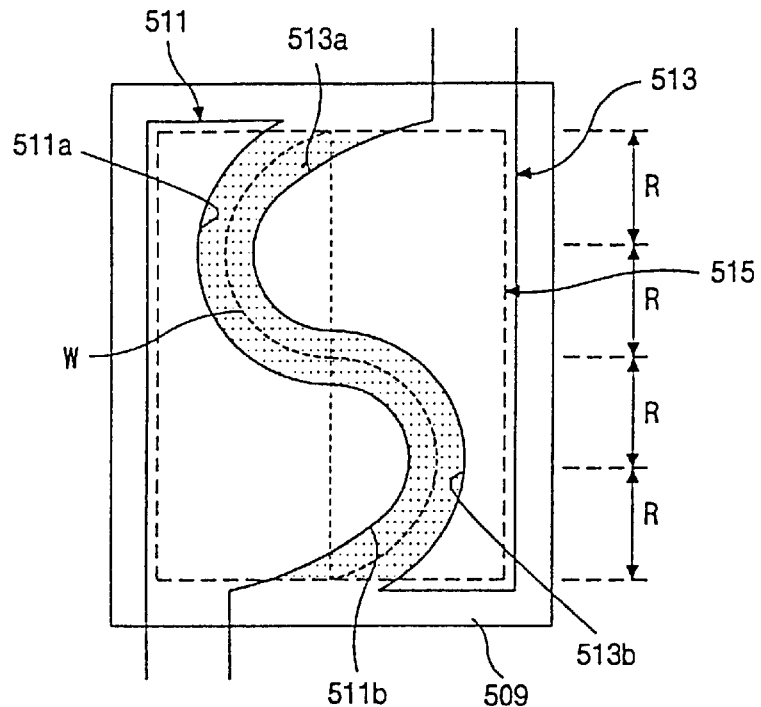
FIG. 7a is a plane view of a sensor TFT according to a third embodiment of the present invention.

FIG. 7a shows a sensor TFT according to a third embodiment of the present invention.

As shown in the drawing, a gate electrode 509 is formed on an insulating layer (not shown) on which a semiconductor layer 515 is formed. Source and drain electrodes 511 and 513 are formed on the semiconductor layer 515. The source electrode 511 comprises a concave semi-circular portion 511a and a convex semi-circular portion 511b extending from the concave semi-circular portion 511a. The drain electrode 513 comprises a convex semi-circular portion 513a spaced apart from and disposed complementary to the concave semi-circular portion 511a of the source electrode 511, and a concave semi-circular portion 513b extending from the convex semi-circular portion 513a and spaced apart from and complementary to the convex semi-circular portion 511b of the source electrode 511a. Therefore, a portion of the semiconductor layer 515 exposed between the source and drain electrodes 511 and 513 becomes S-shaped. This S-shaped portion allows the width of a semiconductor channel to be increased. That is, the width of the channel becomes a sum of the circumferences of the concave and convex semi-circular portions. Accordingly, the width W of the channel can be calculated by the following formula when a radius of each semicircular portion is R:

$$W=(½)*2\pi R*2=2\pi R$$

According to the above formula, the width W of the channel of this embodiment becomes 6.28R.

Figure 7B:
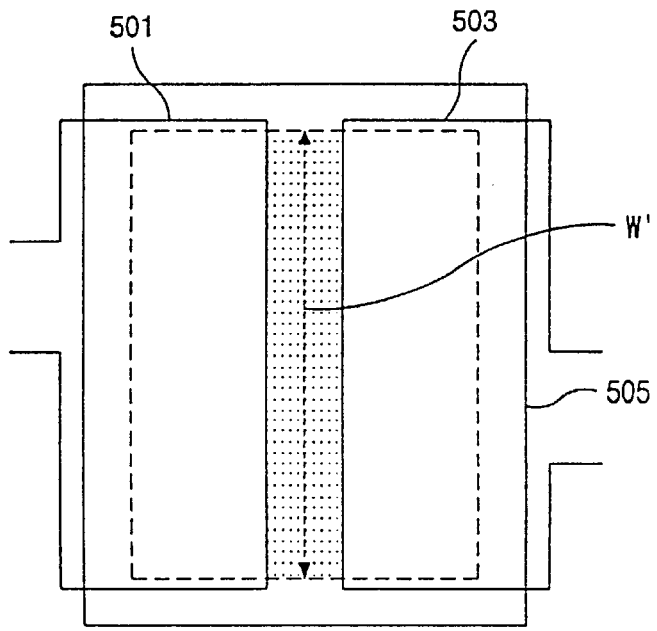
FIG. 7b is a comparative example view for illustrating a difference in a channel width.

If the facing ends of the source and drain electrodes 501 and 503 are formed in a straight line as shown in FIG. 7b, the width W' of the channel becomes 4R.

Accordingly, the width of the channel in this embodiment is increased by 2.28R when compared with the width of the conventional channel shown in FIG. 7b.

Figure 8A:
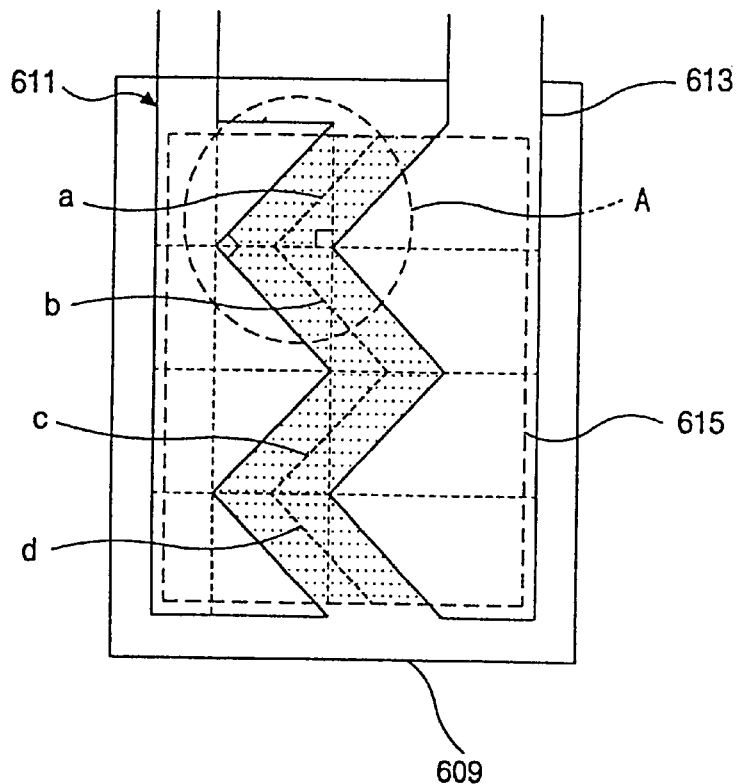
FIG. 8a is a plane view of a sensor TFT according to a fourth embodiment of the present invention.
Figure 8B:
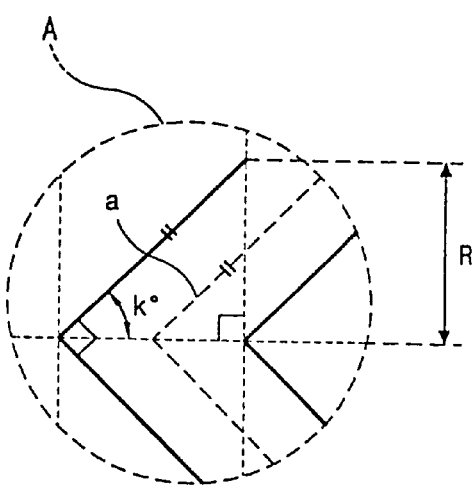

FIG. 8a shows a sensor TFT according to a fourth embodiment of the present invention.

As shown in the drawing, a gate electrode 609 is formed on an insulating layer (not shown) on which a semiconductor layer 615 is formed. Source and drain electrodes 611 and 613 are formed on the semiconductor layer 615.

The source and drain electrodes 611 and 613 face each other at a predetermined distance.

Facing ends of the source and drain electrodes 611 and 613 are saw-toothed complementary to each other. Accordingly, a width of the semiconductor channel of this embodiment becomes a sum of lengths of lines a, b, c and d taken along the saw-toothed ends. When the lengths of the lines a, b, c and d are identical to each other, the length of one line can be calculated according to the following formulas:

$$R=a \sin K \qquad (1)$$

$$a=R/\sin K \qquad (2)$$

wherein K is half of an angle of a valley of the saw-toothed portion, and R is one-fourth the straight-line width of the semiconductor layer.

Accordingly, when assuming that K is 45 degrees, the length of the line "a" becomes √2R. Therefore, the width of the semiconductor channel of this embodiment becomes 5.65R. This shows that the width of this embodiment is longer than the straight-line width by 1.56R.

In the above embodiments, since a second gate electrode, which is formed in the conventional art, is not used in the present invention, the manufacturing process can be simplified. In addition, by varying the shape of the source and drain electrodes, semiconductor layer having a very wide active area can be obtained, increasing the ratio between the width and length.

Other embodiments of the invention will be apparent to those skilled in the art from consideration of the specification and practice of the invention disclosed herein. It is intended that the specification and examples be considered as exemplary only, with the true scope of the invention being indicated by the following claims.

It will be apparent to those skilled in the art that various modifications and variation can be made in the thin film transistor type photo detecting sensor, thin film transistor and the method for fabricating of same of the present invention without departing from the spirit or scope of the invention. Thus, it is intended that the present invention cover the modifications and variations of this invention provided they come within the scope of the appended claims and their equivalents.

What is claimed is:

1. A sensor thin film transistor (TFT), comprising:
   a substrate;
   a gate electrode formed on the substrate;
   an insulating layer on the gate electrode;
   a semiconductor layer patterned on the insulating layer;
   source and drain electrodes formed on the semiconductor layer, the source and drain electrodes being spaced apart from each; and
   a conductive channel defined by an area of the semiconductor layer between the source and drain electrodes, wherein the conductive channel is non-rectangularly shaped.

2. The sensor TFT of claim 1, wherein the source and drain electrodes are made of a material selected from a group consisting of ITO, $TiO_2$ and $SnO_2$.

3. The sensor TFT of claim 1, wherein the conductive channel has at least one curve.

4. The sensor TFT of claim 1, wherein the conductive channel is S-shaped.

5. The sensor TFT of claim 1 wherein the conductive channel is saw-tooth-shaped.

6. The sensor TFT of claim 1, wherein the gate electrode is rectangularly-shaped having first, second, third and fourth sides, the first side being connected to a gate wire.

7. The sensor TFT of claim 6, wherein
the source electrode comprises:
    a plurality of horizontal portions disposed parallel to the first side of the gate electrode, and
    a vertical portion interconnecting ends of the horizontal portions proximal to the second side of the gate electrode, the vertical portion being connected to a source electrode wiring, and
wherein the drain electrode comprises:
    a plurality of horizontal portions which are disposed in parallel between the horizontal portions of the source electrode, and
    a vertical portion interconnecting ends of the horizontal portions proximal to the third side of the gate electrode.

8. The sensor TFT of claim 7, wherein
the source electrode comprises:
    a vertical portion connected to a source electrode wiring and disposed parallel to the second side of the gate electrode,
    a first horizontal portion extending from a first end of the vertical portion proximal and parallel to the first side of the gate electrode,
    a second horizontal portion extending from a second end of the vertical portion proximal and parallel to the fourth side of the gate electrode, and
    a plurality of vertical branch portions alternately connected to the first and second horizontal portions to be parallel to the vertical portion, and
wherein the drain electrode is disposed at a predetermined distance from each portion of the source electrode.

9. The sensor TFT of claim 1, wherein the source and drain electrodes are each transparent.

10. The sensor TFT of claim 9, wherein the conductive channel is S-shaped.

11. The sensor TFT of claim 9, wherein the conductive channel is saw-tooth-shaped.

12. The sensor TFT of claim 9, wherein the gate electrode is rectangularly-shaped having first, second, third and fourth sides, the first side being connected to a gate wire.

13. An optical sensor device comprising:
    a gate electrode formed on a substrate;
    an insulating layer formed on the gate electrode;
    a semiconductor layer formed on the insulating layer; and
    transparent source and drain electrodes formed on the semiconductor layer, the source and drain electrodes being spaced apart from each to define a conductive channel.

14. The optical sensor device of claim 13, wherein the source and drain electrodes are made of a material selected from a group consisting of ITO, $TiO_2$ and $SnO_2$.

15. The optical sensor device of claim 13, wherein the conductive channel has at least one curve.

* * * * *